United States Patent

Schemansky et al.

[11] Patent Number: 5,461,355
[45] Date of Patent: Oct. 24, 1995

[54] FOOT SWITCH WITH A FORCE-SENSING RESISTOR DRIVEN BY A CURRENT SOURCE AND ACTUATED BY A DOME-SHAPED PAD

[75] Inventors: Kevin J. Schemansky, Portage; Jerry A. Culp, Oshtemo Township, Kalamazoo County, both of Mich.

[73] Assignee: Stryker Corporation, Kalamazoo, Mich.

[21] Appl. No.: 167,736

[22] Filed: Dec. 15, 1993

[51] Int. Cl.⁶ .............................. H01C 10/10; H01H 3/14
[52] U.S. Cl. .................... 338/108; 200/61.89; 200/86.5; 338/153
[58] Field of Search ................................ 200/865, 61.89; 338/2, 108, 110, 153

[56] References Cited

U.S. PATENT DOCUMENTS 4,639,710  1/1987  McMillian .................... 200/86.5 X
4,970,486  11/1990  Gray et al. ......................... 338/2
4,978,177  12/1990  Ingraham et al. .............. 200/61.89 X

*Primary Examiner*—J. R. Scott
*Attorney, Agent, or Firm*—Flynn, Thiel, Boutell & Tanis

[57] ABSTRACT

A foot switch includes a base member having an upwardly facing surface, a force sensing resistor disposed on the surface and coupled electrically to a sensing circuit, and an actuating layer disposed on the force sensing resistor and the base member surface. The actuating layer has an elevated portion which is substantially centered over the force sensing resistor, the elevated portion having a convex upper surface which is a portion of a spherical surface. The sensing circuit includes a constant current source connected in series with the force sensing resistor between ground and a predetermined voltage.

22 Claims, 4 Drawing Sheets

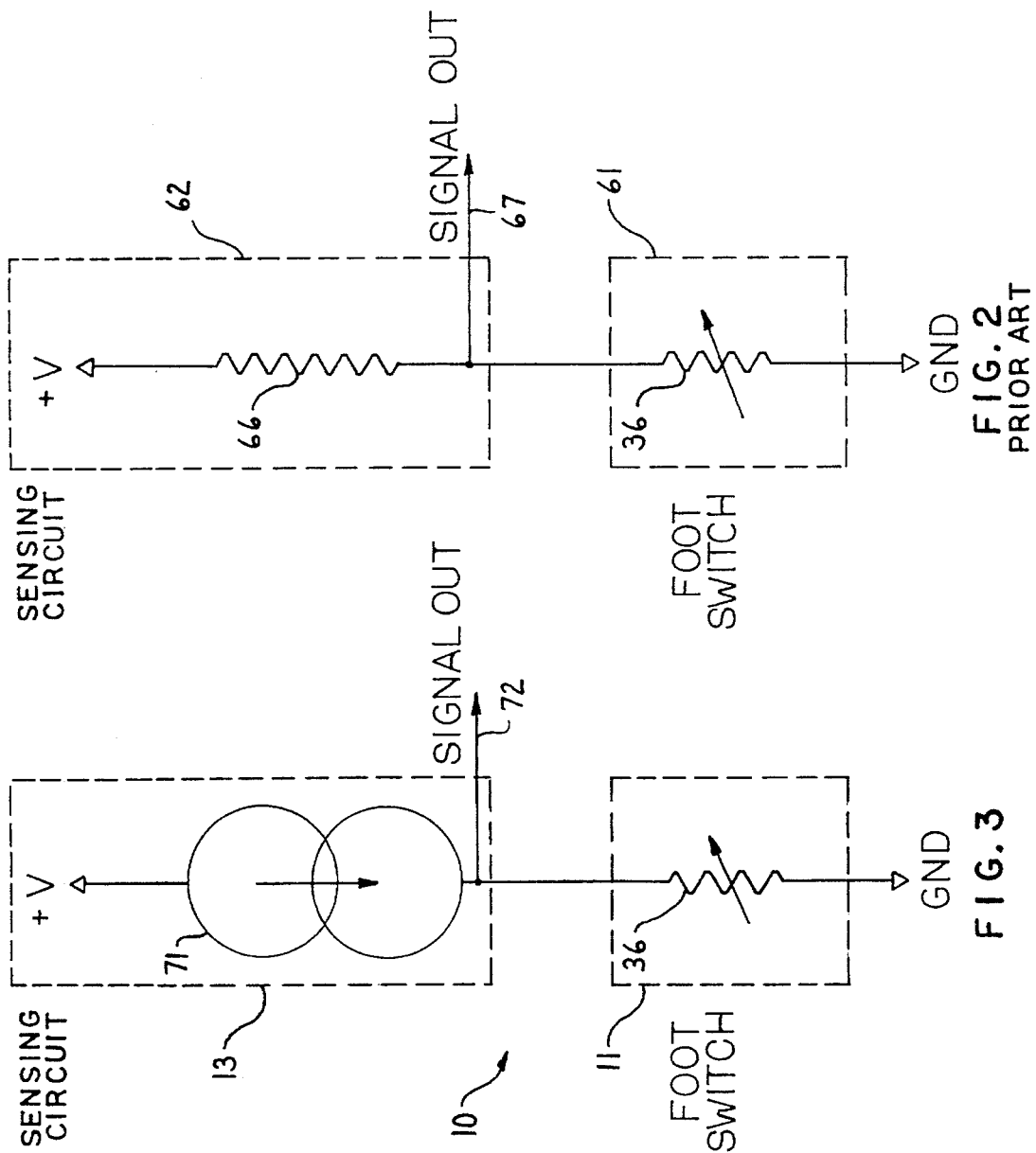

FOOT SWITCH WITH A FORCE-SENSING RESISTOR DRIVEN BY A CURRENT SOURCE AND ACTUATED BY A DOME-SHAPED PAD

FIELD OF THE INVENTION

The present invention relates generally to a foot switch coupled to a sensing circuit and, more specifically, to a foot switch containing a force sensing resistor and a sensing circuit which senses the resistance of the force sensing resistor.

BACKGROUND OF THE INVENTION

A "no-travel" foot switch is one in which the manually actuated part carries out little or no physical movement when actuated. Traditionally, foot switches of this type were limited to switches capable only of on/off operation. In order to have an output signal which varied progressively in response to progressively increasing manual operation, it was necessary to have a manually actuated part which moved through a range of physical movement and was connected to a rheostat or the like.

A relatively new component known as a force sensing resistor, which is itself conventional for purposes of the present invention, has been used to provide a no-travel foot switch with a progressively variable output. More specifically, the force sensing resistor is a relatively flat element with two terminals, and progressively varies a resistance between the terminals in response to progressively increasing compressive forces in a direction perpendicular to the plane of the element.

A known foot switch using a force sensing resistor has the force sensing resistor disposed on an upwardly facing surface of a base member, and has a layer of firm rubber of uniform thickness provided over the upwardly facing surface and the force sensing resistor. To operate the foot switch, a foot is placed on the upper side of the rubber layer and pressed downwardly. The rubber layer does not move to any perceptible extent, thus providing a no-travel feel, but a progressively increasing force acting through the rubber layer onto the force sensing resistor causes the force sensing resistor to vary its resistance as a function of the pressure exerted. In this conventional arrangement, the resistance of the force sensing resistor is normally detected by connecting the force sensing resistor in series with another resistor between ground and a DC voltage, and then monitoring the voltage at the node between the resistors. While this approach has been generally adequate for its intended purposes, it has not been satisfactory in all respects.

More specifically, if the foot is precisely centered over the force sensing resistor when engaging the rubber layer, then a given amount of pressure will produce a given resistance value from the force sensing resistor, whereas if the foot is somewhat offset from the centered position on the rubber layer, some or all of the applied force will act through the rubber layer onto the surface of the base member rather than onto the force sensing resistor, as a result of which the same given pressure will produce a significantly different resistance from the force sensing resistor. Consequently, the foot switch can be somewhat difficult to use in a manner which is reliable and consistent.

A further consideration is that the above-mentioned sensing arrangement introduces a nonlinearity. In particular, the variation of the resistance of the force sensing resistor changes the overall resistance of the two series-connected resistors, and thus changes the amount of current flowing through both resistors, which in turn introduces into the output signal from the sensing circuit a nonlinearity with respect to the pressure applied, above and beyond any nonlinearity which may be inherent to the force sensing resistor itself. Further, the sensing resistor must typically be given a value large enough to ensure that the maximum current through the force sensing resistor does not exceed a maximum allowable current level, which in turn can increase the susceptibility of the sensing arrangement to noise.

Accordingly, one object of the present invention is to provide an improved foot switch of the type using a force sensing resistor, which minimizes or eliminates the effects of misalignment of a foot with respect to the foot switch, in order to provide a reliable and consistent output in response to a given amount of applied pressure.

A further object is to provide a sensing arrangement for a foot switch of the type using a force sensing resistor, which avoids introducing nonlinearities beyond those inherent to the force sensing resistor itself, which provides a high degree of noise immunity, and which ensures that the current through the force sensing resistor will never exceed a maximum allowable level.

SUMMARY OF THE INVENTION

The objects and purposes of the invention, including those set forth above, are met according to one form of the present invention by providing a foot switch apparatus which includes: a base member having an upwardly facing surface, a force sensing resistor disposed on the surface, and an actuating layer provided over the force sensing resistor, the actuating layer having on a side thereof opposite from the force sensing resistor an elevated portion which is substantially aligned with the force sensing resistor.

A different form of the present invention involves an apparatus which includes: a manually actuatable switch mechanism having a force sensing resistor with a resistance which varies progressively in response to progressive manual actuation of the switch mechanism, and a sensing circuit coupled to the force sensing resistor for producing an output signal which varies with changes in the resistance of the force sensing resistor, wherein the sensing circuit includes a current source, the current source and the force sensing resistor being coupled in series with each other.

BRIEF DESCRIPTION OF THE DRAWINGS

A preferred embodiment of the present invention is described in detail hereinafter with reference to the accompanying drawings, in which:

FIG. 2 is an electrical schematic for a conventional foot switch and sensing circuit;

FIG. 3 is an electrical schematic similar to FIG. 2 but showing a sensing circuit according to the present invention;

DETAILED DESCRIPTION

Figure 1:
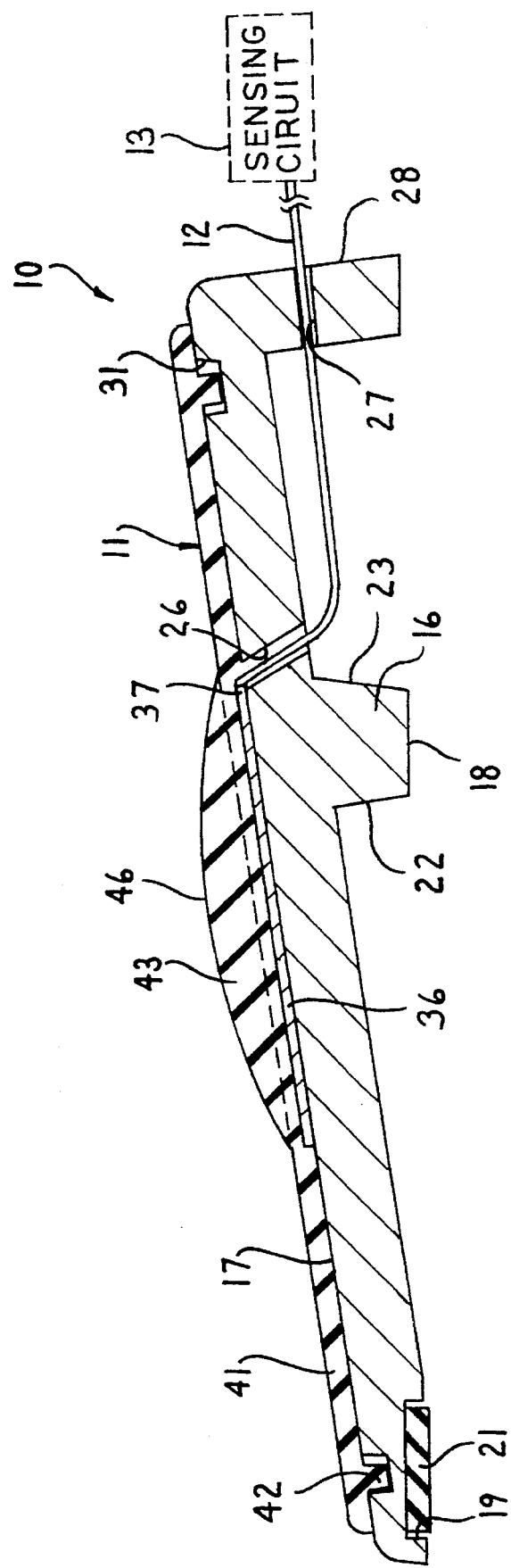
FIG. 1 is a diagrammatic sectional side view of a foot switch embodying the present invention, and an associated sensing circuit.

FIG. 1 shows a no-travel foot switch apparatus 10 which embodies the present invention, including a foot switch 11 coupled by a cable 12 to a sensing circuit 13.

The foot switch 11 includes an approximately wedge-shaped metal base member 16 having a generally horizontal bottom surface 18 which can engage a floor and having a slightly inclined top surface 17. The base member 16 has at one edge of the bottom surface 18 a recess 19, and a rubber pad 21 is disposed in the recess 19 and can engage a not-illustrated floor in order to prevent the foot switch 11 from sliding around when it is in use.

The base member 16 has two cavities 22 and 23 which open into it from the bottom surface 18, has a hole 26 extending through it from the top surface 17 to the cavity 23, and has a further hole 27 extending through it from the cavity 23 to a rear surface 28. An endless groove 31 is provided in the inclined top surface 17, and extends completely around a central portion of the top surface 17.

A conventional force sensing resistor (FSR) 36 is disposed on the central portion of the surface 17 so that the groove 31 extends around the FSR 36. The FSR is a relatively flat element with two terminals, and progressively varies a resistance between the terminals in response to progressively increasing compressive forces in a direction perpendicular to the plane of the element. In the preferred embodiment, the FSR 36 is obtained commercially from Interlink Electronics of Carpinteria, Calif. as Part No. 306B1. The FSR 36 has an end 37 which is adjacent the upper end of the hole 26, and two wires in the cable 12 are connected to respective terminals of the FSR, the cable 12 extending through the hole 26, cavity 23 and hole 27 to the sensing circuit 13.

A solid rubber layer 41 extends over the FSR 36 and the top surface 17. The rubber layer 41 has a substantially uniform thickness, except that it has on its underside an endless rib 42 which is received in the endless groove 31, and has on its upper side a dome-shaped crown or elevation 43 which is centered over the FSR 36. In the preferred embodiment, the elevation 43 has the shape of a portion of a sphere, and is therefore circular when viewed from the top. The elevation 43 thus has an upper surface 46 which is convex, and which in particular is equivalent to a portion of the exterior surface of a sphere. The rib 42 of the rubber layer 41 is preferably secured in the groove 31 by a conventional and suitable adhesive disposed in the groove.

In use, an operator places his or her foot onto the rubber layer 41, where it will naturally tend to contact the elevation 43. As the operator presses downwardly with increasing force, a progresslively increasing pressure will be exerted onto the FSR 36 in a direction normal to the plane of the FSR, which will cause the resistance of the FSR to progressively change. Due to the elevation 43, the operator's foot will tend to engage a portion of the elevation 43 rather than an adjacent flat portion of the rubber layer 41, and thus the downward forces exerted by the operator's foot onto the rubber layer 41 will tend to be reliably applied directly to elevation 43 and then to the FSR 36 below it, rather than to any portion of the rubber layer 41 which is offset horizontally from the FSR 36. In fact, the elevation 43 allows a relatively significant misalignment of a foot relative to the FSR while maintaining a consistent foot switch output relative to the pressure exerted.

FIG. 2 is a diagrammatic view of a conventional foot switch apparatus, in which a foot switch 61 includes a conventional FSR and is connected to a conventional sensing circuit 62. The sensing circuit 62 is basically a resistor 66 connected in series with the FSR 36 between ground and a voltage from a power source. A voltage at the node between the resistors 36 and 66 serves as an output signal 67. In other words, as the resistance of the FSR 36 varies, the magnitude of the voltage of the output signal at 67 also varies. However, it will be recognized that, as the resistance of the FSR varies, the total resistance of resistors 36 and 66 will vary, and thus the amount of current flowing through the resistors 36 and 66 will vary. Consequently, in addition to certain nonlinearities which are inherent to the FSR 36 and tend to affect the linearity of the output signal 67 relative to the amount of pressure exerted on the FSR 36, the variation of the amount of current flow introduces a further nonlinearity in the output signal 67 relative to the pressure exerted.

A further consideration with this conventional arrangement is that the resistor 66 must be sufficiently large to ensure that the actual current flow through both resistors does not exceed the maximum current level which the FSR 36 is designed to tolerate, but giving the resistor 66 a large resistance can result in increased susceptibility to noise.

FIG. 3 is another view of the foot switch apparatus 10 of FIG. 1, in which the foot switch 11 is depicted diagrammatically, and the pertinent circuitry within the sensing circuit 13 is depicted diagrammatically. In particular, the sensing circuit 13 includes a constant current source circuit 71 which is connected in series with the FSR 36 between ground and a voltage. The node between the current source 71 and the FSR 36 serves as an output signal 72.

Figure 4:
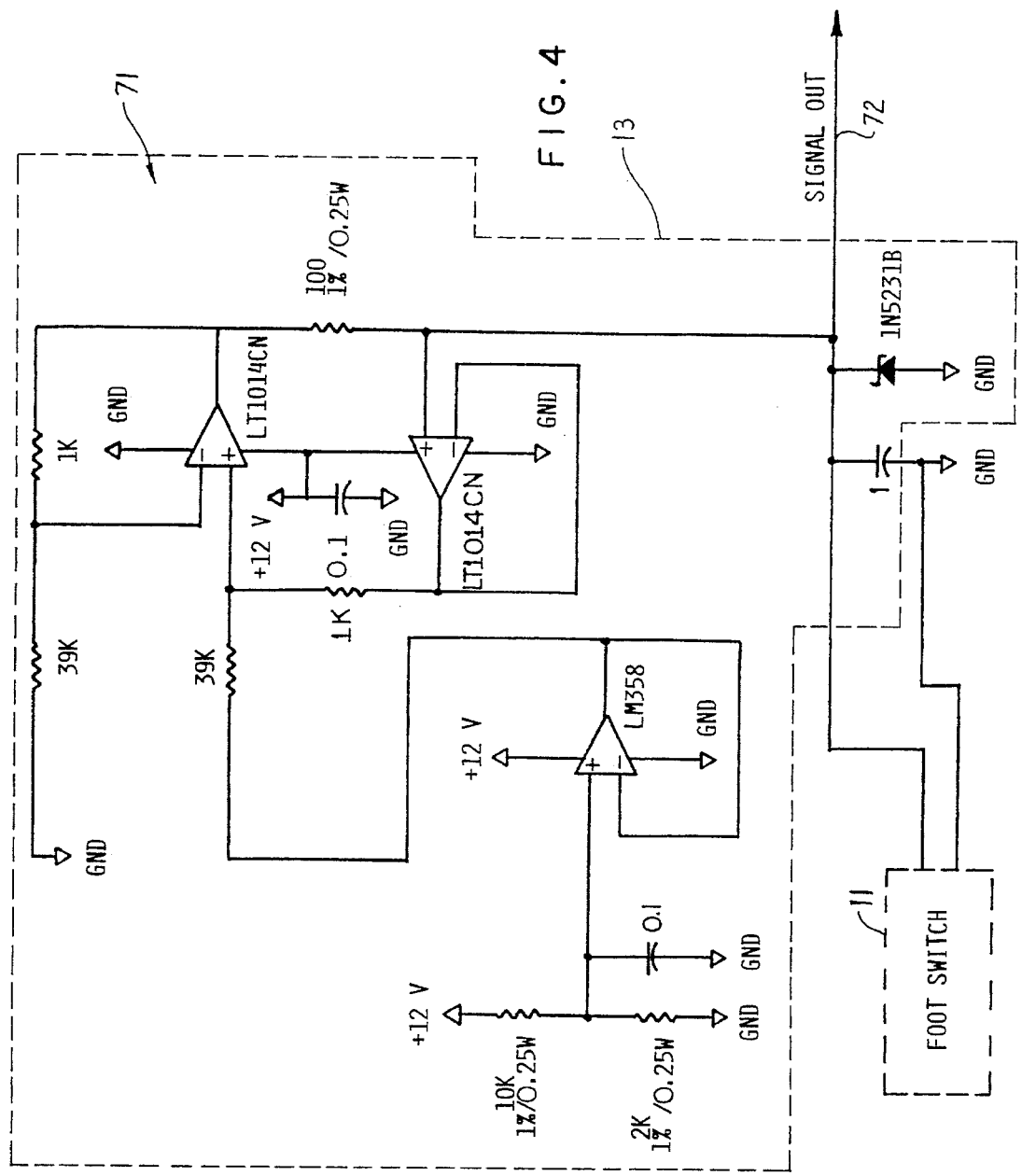
FIG. 4 is an electrical schematic showing in greater detail a portion of the sensing circuit of FIG. 3.

FIG. 4 is a view corresponding to FIG. 3, except that it shows in detail the circuitry used in the preferred embodiment for the current source 71. The specific circuitry of the current source 71 is not in and of itself the focus of the present invention, and is therefore not described here in detail.

As the resistance of the FSR 36 varies, the current source 71 automatically adjusts the amount of current flowing through the FSR 36 so that the current flow remains substantially constant. Thus, the magnitude of the voltage of the output signal 72 varies substantially linearly with respect to changes in resistance of the FSR 36, thereby eliminating nonlinearities in the signal 72 other than those inherent to the internal structure of the FSR 36 itself. In addition, and as mentioned above, the constant current source 71 limits the current flowing through the FSR so that the current never exceeds the maximum current level that the FSR can tolerate. Moreover, as a result of the use of the current source 71, the arrangement of FIG. 3 has a greater degree of noise immunity than the conventional arrangement of FIG. 2.

Figure 5:
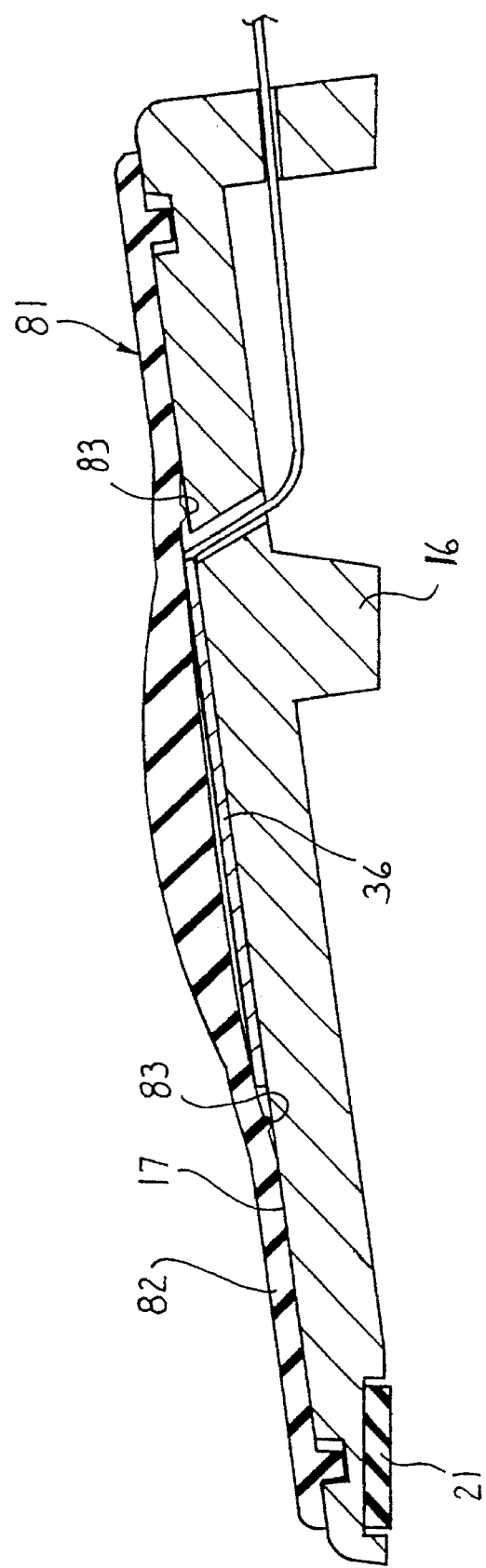
FIG. 5 a diagrammatic section view similar to a portion of FIG. 1 but showing a modified version of the foot switch of FIG. 1.

FIG. 5 is a diagrammatic sectional view similar to a portion of FIG. 1, but showing a foot switch 81 which is a modified version of the foot switch of FIG. 1. More specifically, the foot switch 81 includes a base member 16, pad 21 and FSR 36 which are identical to those of FIG. 1. The only difference is the rubber layer 82 of the foot switch 81. In particular, the rubber layer 82 is identical to the rubber layer 41 of FIG. 1, except that the rubber layer 82 has on the underside thereof a further downwardly projecting rib 83 which extends around the FSR 36 a small distance outwardly thereof and which engages the top surface 17 of the base member 16. The endless rib 83 has a small vertical height corresponding approximately in dimension to the thickness of the FSR 36. The purpose of the rib 83 is to ensure that, when an operator does not have his foot on the rubber layer 82, the rubber layer 82 is not exerting any force on the FSR 36 which would cause the FSR 36 to produce a small output signal. It will be recognized that, instead of providing the endless rib 83 on the underside of the rubber layer, it would alternatively be possible to provide a very shallow recess in the underside of the rubber layer which is sufficiently large to receive the FSR 36, the depth of the recess being approximately the same as the height of the rib 83.

Although a single preferred embodiment of the invention has been disclosed in detail for illustrative purposes, it will be recognized that there are variations or modifications of the disclosed apparatus, including the rearrangement of parts, which lie within the scope of the present invention.

The embodiments of the invention in which an exclusive property or privilege is claimed are defined as follows:

1. A foot switch apparatus, comprising:

a base member adapted to rest on a floor and having an upwardly facing surface;

a force sensing resistor disposed on said surface; and an actuating layer atop said force sensing resistor, said actuating layer having a foot engageable side facing away from said force sensing resistor for pressing by a foot of an operating person, said foot engageable side including a foot engageable elevated portion which is substantially aligned with said force sensing resistor to overlie same and is raised above adjacent non-elevated portions of said foot engageable side, so that an operator's foot will tend to engage said elevated portion, and through said elevated portion press on said force sensing resistor below it, rather than solely engage adjacent non-elevated portions of said foot engageable side, whereby said elevated portion allows substantial misalignment of an operator's foot laterally of said force sensing resistor while maintaining a consistent foot switch output relative to applied foot pressure.

2. An apparatus according to claim 1, wherein said elevated portion has on an upper side thereof an upwardly facing surface which is substantially convex.

3. An apparatus according to claim 2, wherein said elevation has approximately the shape of a portion of a sphere, said convex surface being a portion of a spherical surface.

4. An apparatus according to claim 3, wherein said actuating layer is made of a rubber material.

5. An apparatus according to claim 1, including means for preventing said actuating layer from applying compressive forces to said force sensing resistor except when a manual force is applied to a side of said actuating layer remote from said force sensing resistor.

6. An apparatus according to claim 5, wherein said means for preventing includes said actuating layer having on an underside thereof an endless rib which extends around said force sensing resistor and engages said surface on said base member, said rib having a height which corresponds approximately to a thickness of said force sensing resistor.

7. An apparatus according to claim 1, wherein said surface on said base member has therein an endless groove extending around said force sensing resistor, and wherein said actuating layer has on an underside thereof a rib which is disposed in said groove.

8. An apparatus according to claim 1, wherein said base has means defining a hole therein which opens through said surface thereon adjacent said force sensing resistor, and including a wire coupled to said force sensing resistor and extending away therefrom through said hole.

9. The apparatus of claim 1 wherein said elevated portion is a dome extending laterally to about the edge of said force sensing resistor and said non-elevated portions are flat and extend laterally away from said force sensing resistor and along said upwardly facing surface of said base member.

10. The apparatus of claim 9 wherein said actuating layer is of a rubber material.

11. The apparatus of claim 10 wherein said rubber material layer covers said force sensing resistor and an adjacent area of said upwardly facing surface of said base member, said rubber material layer having on its underside an endless portion laterally outside said foot engageable elevated portion and secured to said face member by an adhesive.

12. The apparatus of claim 11 in which said endless portion is an endless rib on the underside of said rubber material layer and received in an endless groove in said base member upwardly facing surface and secured therein by said adhesive.

13. The apparatus of claim 11 wherein said base has means defining a hole therein which opens through said surface thereon adjacent said force sensing resistor, and including a wire coupled to said force sensing resistor and extending away therefrom through said hole, said hole and wire are being laterally inboard of said endless adhesively secured groove and rib.

14. An apparatus, comprising: a manually actuatable switch mechanism having a force sensing resistor with a resistance which varies progressively in response to progressive manual actuation of said switch mechanism, and a sensing circuit coupled to said force sensing resistor for producing and output signal which varies with changes in the resistance of said force sensing resistor, wherein said sensing circuit includes a constant current source in series with said force sensing resistor for maintaining substantially a constant current through said force sensing resistor despite changes in the resistance of said force sensing resistor with applied force, such that the voltage drop across said force sensing resistor changes substantially linearly with changes in resistance of said force sensing resistor and hence with changes in force applied to the latter.

15. An apparatus according to claim 14, wherein said output signal is a voltage at a node between said constant current source and said force sensing resistor.

16. An apparatus according to claim 14, wherein said constant current source maintains through said force sensing resistor a substantially constant current flow which is less than a maximum allowable current flow through said force sensing resistor.

17. An apparatus according to claim 14, wherein said switch mechanism includes a base member having an upwardly facing surface on which said force sensing resistor is disposed, and having an actuating layer provided over said force sensing resistor, said actuating layer having on a foot engageable side thereof opposite from said force sensing resistor an elevated portion which is substantially aligned with said force sensing resistor.

18. An apparatus according to claim 17, wherein said elevated portion has on an upper side thereof an upwardly facing surface which is substantially convex.

19. An apparatus according to claim 18, wherein said elevation has approximately the shape of a portion of a sphere, said convex surface being a portion of a spherical surface.

20. An apparatus according to claim 19, wherein said actuating layer is made of a rubber material.

21. An apparatus according to claim 17, wherein said surface on said base member has therein an endless groove extending around said force sensing resistor, and wherein said actuating layer has on an underside thereof a rib which is disposed in said groove.

22. An apparatus according to claim 17, wherein said base has means defining a hole therein which opens through said surface thereon adjacent said force sensing resistor, and including a wire coupled to said force sensing resistor and extending away therefrom through said hole to said sensing circuit.

* * * * *

UNITED STATES PATENT AND TRADEMARK OFFICE
CERTIFICATE OF CORRECTION

PATENT NO. : 5,461,355
DATED : October 24, 1995
INVENTOR(S) : Kevin J. Schemansky, et al It is certified that error appears in the above-indentified patent and that said Letters Patent is hereby corrected as shown below:

Column 6, line 28; change "and" to ---an---.

Signed and Sealed this

Twentieth Day of February, 1996

Attest:

BRUCE LEHMAN

Attesting Officer

Commissioner of Patents and Trademarks